(12) United States Patent
Sriram et al.

(10) Patent No.: US 12,525,501 B2
(45) Date of Patent: Jan. 13, 2026

(54) SEMICONDUCTOR DEVICE

(71) Applicant: Taiwan Semiconductor Manufacturing Company, Ltd., Hsinchu (TW)

(72) Inventors: Pavithra Sriram, Hsinchu (TW); Kuo-Lung Pan, Hsinchu (TW); Po-Yuan Teng, Hsinchu (TW); Cheng-Chieh Wu, Taoyuan (TW); Mao-Yen Chang, Kaohsiung (TW); Yu-Chia Lai, Miaoli County (TW); Shu-Rong Chun, Hsinchu County (TW); Hao-Yi Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 662 days.

(21) Appl. No.: 17/890,210

(22) Filed: Aug. 17, 2022

(65) Prior Publication Data

US 2024/0063075 A1  Feb. 22, 2024

(51) Int. Cl.
*H01L 23/367* (2006.01)
*H01L 21/56* (2006.01)
(Continued)

(52) U.S. Cl.
CPC .......... *H01L 23/367* (2013.01); *H01L 21/563* (2013.01); *H01L 21/565* (2013.01); *H01L 23/3135* (2013.01); *H01L 25/0655* (2013.01); *H01L 25/105* (2013.01); *H01L 23/49816* (2013.01); *H01L 23/49833* (2013.01); *H01L 23/49838* (2013.01); *H01L 24/16* (2013.01); *H01L 24/32* (2013.01); *H01L 24/73* (2013.01); *H01L 2224/16227* (2013.01); *H01L 2224/16238* (2013.01); *H01L 2224/32225* (2013.01); *H01L 2224/73204* (2013.01);
(Continued)

(58) Field of Classification Search
CPC .... H01L 23/367; H01L 21/563; H01L 21/565
See application file for complete search history.

(56) References Cited

U.S. PATENT DOCUMENTS 8,993,380 B2   3/2015  Hou et al.
9,281,254 B2   3/2016  Yu et al.
(Continued)

*Primary Examiner* — Errol V Fernandes
(74) *Attorney, Agent, or Firm* — JCIPRNET

(57) ABSTRACT

A semiconductor device includes a first redistribution structure, a first semiconductor package, a second semiconductor package, an encapsulation layer, a first thermal interface material (TIM) layer, and a second TIM layer. The first semiconductor package and the second semiconductor package are respectively disposed on the first redistribution structure and laterally disposed aside with each other. The encapsulation layer encapsulates and surrounds the first semiconductor package and the second semiconductor package. The first semiconductor package and the second semiconductor package are respectively exposed from the encapsulation layer. The first TIM layer and the second TIM layer are respectively disposed on back surfaces of the first semiconductor package and the second semiconductor package. A top surface of the first TIM layer and a top surface of the second TIM layer are coplanar with a top surface of the encapsulation layer.

20 Claims, 16 Drawing Sheets

(51) Int. Cl.
  H01L 23/31  (2006.01)
  H01L 25/065  (2023.01)
  H01L 25/10  (2006.01)
  H01L 23/00  (2006.01)
  H01L 23/498  (2006.01)

(52) U.S. Cl.
  CPC ............... *H01L 2924/1427* (2013.01); *H01L 2924/1431* (2013.01); *H01L 2924/1434* (2013.01); *H01L 2924/1811* (2013.01); *H01L 2924/182* (2013.01); *H01L 2924/3511* (2013.01); *H01L 2924/37001* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2020/0219789 A1* | 7/2020 | Uppal ................. H01L 21/4882 |
| 2021/0125896 A1* | 4/2021 | Arrington ............... H01L 23/42 |

* cited by examiner

SEMICONDUCTOR DEVICE

BACKGROUND

Semiconductor devices and integrated circuits used in a variety of electronic apparatus, such as cell phones and other mobile electronic equipment, are typically manufactured on a single semiconductor wafer. The circuits of the wafer may be processed and packaged with other semiconductor devices or circuits at the wafer level, and various technologies have been developed for wafer level packaging (e.g., formation of redistribution circuit structures/layers) utilized in the different circuit packages having asymmetrical heights on the single semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
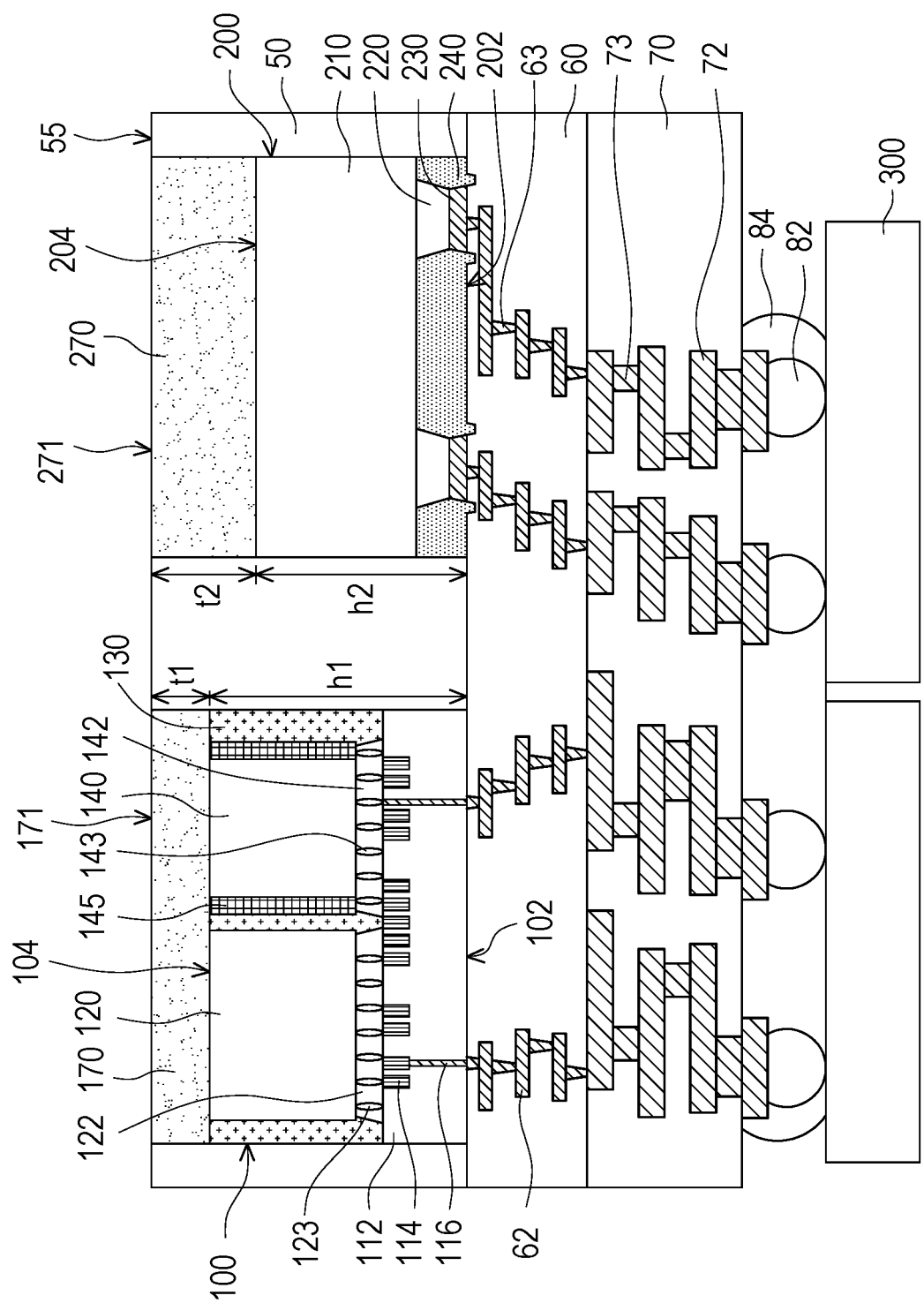
FIG. 1 illustrates a cross sectional view of a semiconductor device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, manufacturing processes may include forming multi-chip package structures using Chip-on-Wafer-on-Substrate (CoWoS) packaging processing. Other embodiments may also using other processing, including integrated fan-out (InFO) packaging processing. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIG. 1 illustrates a cross sectional view of a semiconductor device 10 according to some exemplary embodiments of the present disclosure. In the present embodiment, the semiconductor device 10 includes a first redistribution structure 60, a first semiconductor package 100, a second semiconductor package 200, an encapsulation layer 50, a first thermal interface material (TIM) layer 170, a second TIM layer 270. As shown in FIG. 1, the first semiconductor package 100 is disposed on the first redistribution structure 60. The second semiconductor package 200 is disposed on the first distribution structure 60 and laterally disposed aside the first semiconductor package 100. In accordance with the present embodiment in FIG. 1, the encapsulation layer 50 encapsulates and surrounds the first semiconductor package 100 and the semiconductor package 200. The first semiconductor package 100 and the second semiconductor package 200 are respectively exposed from the encapsulation layer 50.

In the present embodiment, the first TIM layer 170 is disposed on a back surface 104 of the first semiconductor package 100, and the second TIM layer 270 is disposed on a back surface 204 of the second semiconductor package 200. In the present embodiment, a top surface 171 of the first TIM layer 170 and a top surface 271 of the second TIM layer 270 are coplanar with a top surface 55 of the encapsulation layer 50. As shown in FIG. 1, a vertical thickness t1 of the first TIM layer 170 is different from a vertical thickness t2 of the second TIM layer 270. For example, in the present embodiment, the vertical thickness t1 of the first TIM layer 170 is thinner than the vertical thickness t2 of the second TIM layer 270.

In the present embodiment, a vertical height h1 of the first semiconductor package 100 is varied from a vertical height h2 of the second semiconductor package 200. For example, as shown in FIG. 1, the vertical height h1 of the first semiconductor package 100 is greater than the vertical height h2 of the second semiconductor package 200. In some embodiments, a difference between the vertical height h1 of the first semiconductor package 100 and the vertical height h2 of the second semiconductor package 200 is in a range from 5 microns to 8 microns.

As shown in FIG. 1 the first semiconductor package 100 and the second semiconductor package 200 disposed together on the first redistribution structure 60 have asymmetrical heights, and their height difference may be compensated by the vertical thickness difference between the first TIM layer 170 and the second TIM layer 270.

In some embodiments, the above configurations of the first semiconductor package 100, the second semiconductor package 200, the first TIM layer 170, and the second TIM layer 270 may be applied to a wafer-scale heterogenous integration of semiconductor dies or packages with asymmetrical heights, which may be significant to high performance computing (HPC) applications. Specifically, through the above configurations, a substantially 35% increase in a wafer scale chip packaging density may be attained, which may result in increase in bandwidth density, and thus a 20 times enhancement in computing performance may be obtained.

Referring again to FIG. 1, the semiconductor device 100 may further include a second semiconductor structure 70 disposed on the first semiconductor structure 60. As shown in FIG. 1, the first redistribution structure 60 is disposed between the front surface 102 of the first semiconductor structure 100, the front surface 202 of the second semiconductor structure 200, and the second redistribution structure 70.

In some embodiments, the first redistribution structure 60 may include a plurality of conductive pattern layers 62 disposed along a thickness direction of the first redistribution structure 60 and horizontally extended along a lateral direction thereof, and a plurality of conductive vias 63 are respectively electrically connected between the conductive pattern layers 62.

In some embodiments, the second redistribution structure 70 may include a plurality of conductive pattern layers 72 disposed along a thickness direction of the redistribution structure 70 and horizontally extended along a lateral direction thereof, and a plurality of conductive vias 73 may be respectively and electrically connected between the conductive pattern layers 72.

In some embodiments, the first redistribution structure 60 and the second redistribution structure 70 may be a redistribution circuit layers for an InFO package, and may be formed by, for example, depositing conductive layers, patterning the conductive layers to form redistribution circuits, partially covering the redistribution circuits and filling the gaps between the redistribution circuits with dielectric layers, etc. The material of the redistribution circuits may include a metal or a metal alloy including aluminum, copper, tungsten, and/or alloys thereof. The dielectric layers may be formed of dielectric materials such as oxides, nitrides, carbides, carbon nitrides, combinations thereof, and/or multi-layers thereof. The redistribution circuits are formed in the dielectric layers and electrically connected to the semiconductor devices (e.g., the first semiconductor package 100 and second semiconductor package 200) disposed thereon.

In some embodiments, as shown in FIG. 1, a plurality of voltage regulator modules 300 are also included in the semiconductor device 10. In the present embodiment, the voltage regulator modules 300 are disposed above (or below, as shown in FIG. 1) the second redistribution structure 70, and a plurality of the conductive elements 82, such as solder joints, are disposed between the voltage regulator modules 300 and the second redistribution structure 70, and an underfill 84 is filled therebetween to disposed aside and surround the conductive elements 82. As shown in FIG. 1, the conductive elements 82 are connected to the conductive pattern layers 72 to electrically connect the voltage regulator modules 300 and the second redistribution structure 70.

In some other embodiments, the conductive elements 82 may be micro-bumps, such as micro-bumps having copper metal pillars. In some other embodiments, the conductive elements 82 may be solder bumps, lead-free solder bumps, or micro bumps, such as controlled collapse chip connection (C4) bumps or micro bumps containing copper pillars. In some embodiments, the underfill 84 may include, for example, an epoxy resin, a phenol resin, a urethane resin, a silicone resin, a polyimide resin, etc.

In some other embodiments, the first semiconductor package 100 may include a system on chip (SOC) circuit 120 and a memory component 140 laterally disposed aside with each other. In some embodiments, the SOC circuit 120 and the memory component 140 are together encapsulated and surrounded by an insulating encapsulation 130. In some embodiments, the memory component 140 is laterally surrounded by a molding compound 145, and the molding compound 145 is interposed between the memory component 140 and the insulating encapsulation 130. In some embodiments, the molding compound 145 may be made of a resin (such as epoxy) material or the like. In some embodiments, the molding compound 145 may be formed by a molding process.

In some embodiments, the memory component 140 may be a high bandwidth memory (HBM) component. In some alternative embodiments, the memory component 110 may be a dynamic random access memory (DRAM) component, a static random access memory (SRAM) component, a hybrid memory cube (HMC) component, or the like.

In some embodiments, the first semiconductor package 100 may include a redistribution layer 112 disposed between the SOC circuit 102, the memory component 140, and the first redistribution structure 60. In the present embodiment, the redistribution layer 112 may include a plurality of conductive elements 114 and a plurality of through vias 116 electrically connected between the conductive elements 114 and the conductive vias 63 of the first semiconductor structure 60.

Referring again to FIG. 1, a plurality of microbumps 123 may be disposed between the SOC circuit 120 and the redistribution layer 112, and an underfill 122 is filled therebetween. The SOC circuit 120 is electrically connected to the redistribution layer 112 and the first redistribution structure 60 through the microbumps 123 and the conductive elements 114.

In some embodiments, a plurality of microbumps 143 may be disposed between the memory component 140 and the redistribution layer 112, and an underfill 142 is filled therebetween. The memory component 140 is electrically connected to the redistribution layer 112 and the first redistribution structure 60 through the microbumps 143 and the conductive elements 114.

Referring to the embodiment shown in FIG. 1 of the disclosure, the second semiconductor package 200 may include a SOC circuit 210. A plurality of conductive elements 230 are disposed between the SOC circuit 210 and the first redistribution structure 60, and a plurality of UBM patterns 220 respectively disposed between the SOC circuit 210 and the conductive elements 230. Moreover, an underfill 240 is filled between the SOC circuit 210 and the first redistribution structure 60 to surround the UBM patterns 230 and the conductive elements 240.

In some other embodiments not illustrated, based on the specific application, the SOC circuit 210 may be replaced with a logic die including a central processing unit (CPU) die, a graphic processing unit (GPU) die, and a microcontroller, etc.

Figure 2A:
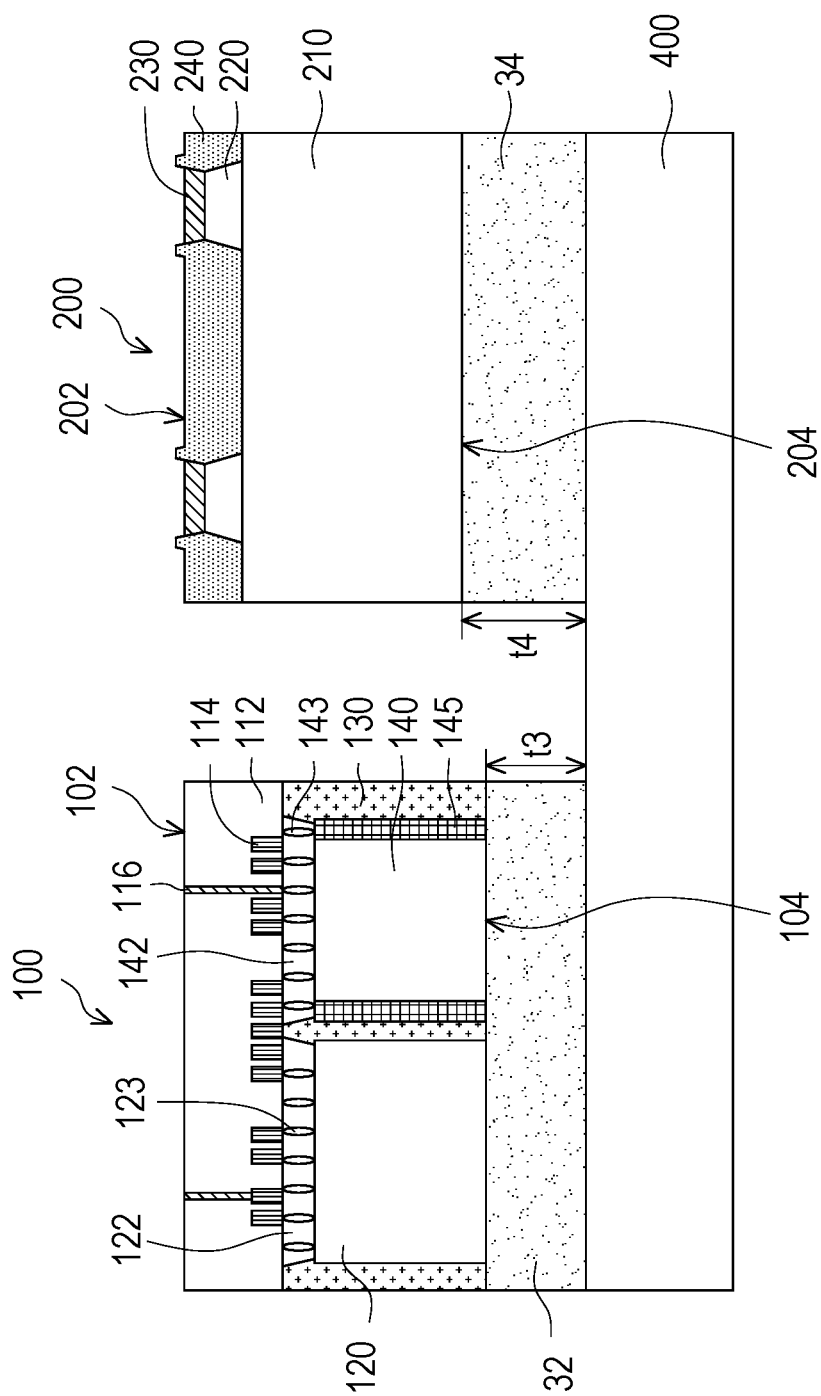
FIG. 2A to FIG. 2C illustrate cross sectional views of intermediate stages in a manufacturing of a semiconductor device according to some exemplary embodiments of the present disclosure.
Figure 2B:
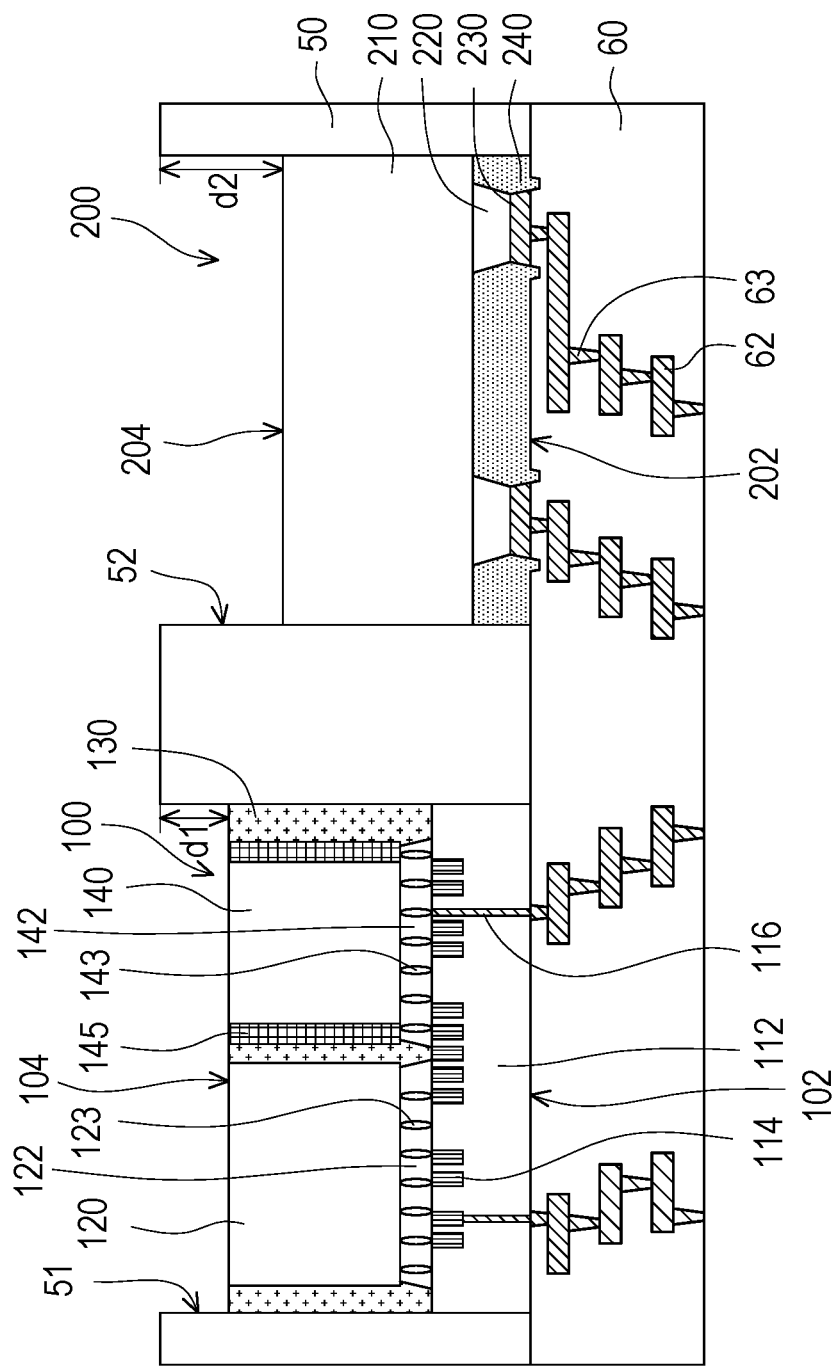
Figure 2C:
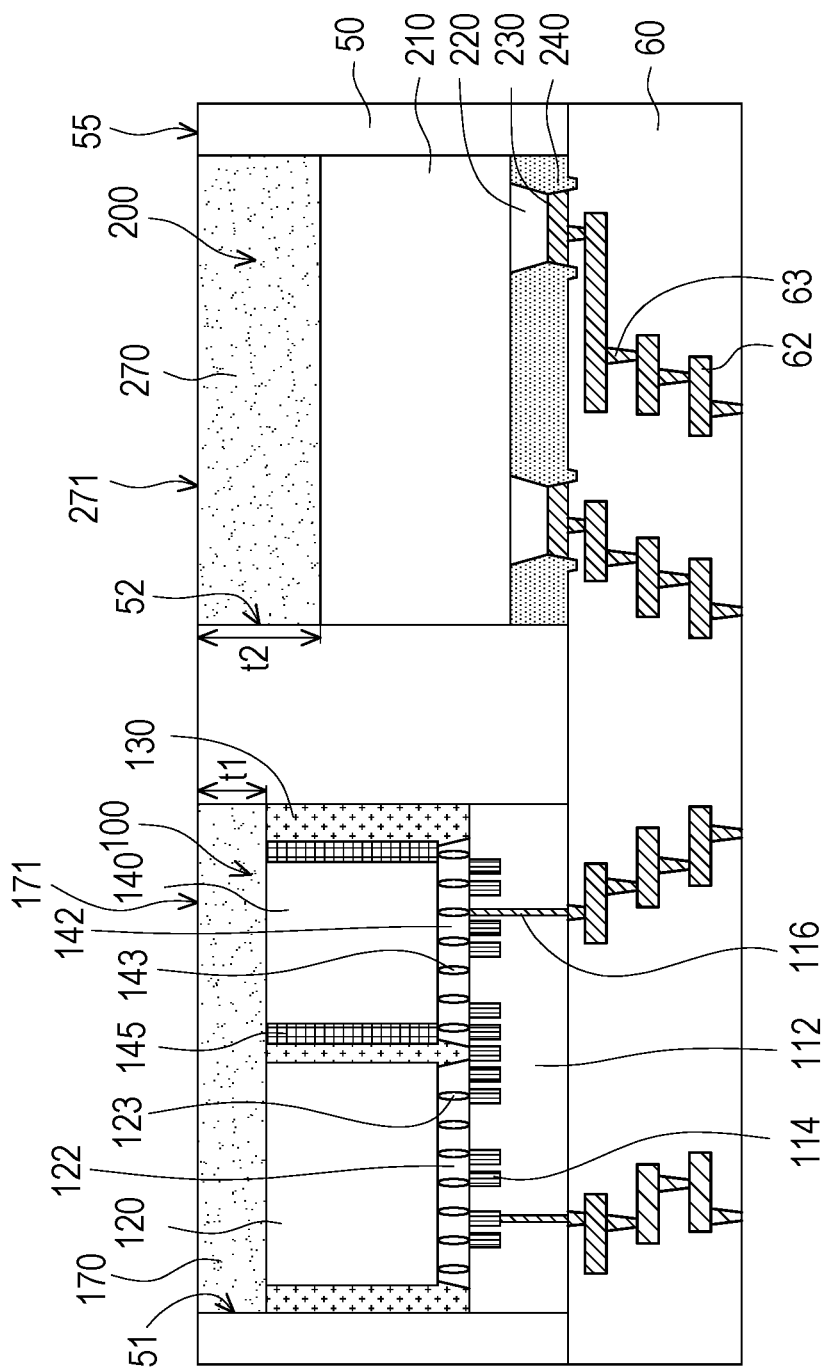

FIG. 2A to FIG. 2C illustrate cross sectional views of intermediate stages in a manufacturing of a semiconductor device 10 according to some exemplary embodiments of the present disclosure. In some embodiments, referring to FIG. 2A, the back surface 104 of the first semiconductor package 100 is attached on a carrier 400 through a first die attach film (DAF) 32 disposed therebetween. In some embodiments, the carrier 400 may be a glass substrate. As shown in FIG. 2A, the back surface 204 of the second semiconductor package 200 is attached on the carrier 400 through a second DAF 34 disposed therebetween.

In the present embodiment, the first DAF 32 may be different from the second DAF 34 in their thicknesses. Specifically, the first DAF 32 may have a vertical thickness t3 thinner than a vertical thickness t4 of the second DAF 34 to compensate the asymmetrical vertical height difference, which is about 25 microns, between the first semiconductor package 100 and the second semiconductor package 200, such that a front surface 102 of the first semiconductor package 100 may be substantially aligned or coplanar with a front surface 202 of the semiconductor package 200 for performing subsequent manufacturing processes on the front surface 102 of the first semiconductor package 100 and the front surface 202 of the second semiconductor package 200.

As shown in FIG. 2B, after the first semiconductor package 100 and the second semiconductor package 200 are attached to the carrier 400, an encapsulation material is deposited on the carrier 400 to form the encapsulation layer 50, which laterally encapsulates and surrounds the first semiconductor package 100 and the second semiconductor package 200. In some embodiments, the encapsulation material for forming the encapsulation layer 50 may include, for example, a resin material (such as epoxy resins, phenolic resins, silicon-containing resins, or other suitable resins), a dielectric material having low permittivity (DK) and low loss tangent (DF) properties, or other suitable materials. In some other embodiments, the encapsulation material for forming the encapsulation layer 50 may further include inorganic fillers (e.g., silica) or other inorganic compounds to optimize coefficient of thermal expansion (CTE) of the encapsulation material. The disclosure is not limited thereto.

In some embodiments not illustrated, after depositing the encapsulation material, a planarization process, for example a mechanical grinding process or a chemical mechanical polishing (CMP) process, may be applied to remove an excessive portion of the encapsulating material to align the surface of the encapsulation layer 50 with the front surface 102 of the first semiconductor package 100 and the front surface 202 of the second semiconductor package 200 for performing following manufacturing steps thereon.

Referring again to FIG. 2B, in the current step of the manufacturing process, the carrier 400 is flipped to attach both a front surface 102 of the first semiconductor package 100 and a front surface 202 of the second semiconductor package 200 to the first redistribution structure 60. Subsequently, the carrier 400 is debonded from the first semiconductor package 100 and the second semiconductor package 200.

As shown in FIG. 2B, after attaching the first semiconductor package 100 and the second semiconductor package 200 to the first redistribution structure 60 and debonding the carrier 400, the first DAF 32 and the second DAF 34 are cleaned and removed from the first semiconductor package 100 and the second semiconductor package 200 to expose the back surfaces 104 and 204 thereof. In some embodiments, the first DAF 32 and the second DAF 34 may be water soluble and may be removed with an aqueous solution.

Referring to FIG. 2B, a first trench 51 and a second trench 52 within the encapsulation layer 50 are correspondingly formed above the first semiconductor package 100 and the second semiconductor package 200, and a vertical depth d1 of a first trench 51 is substantially smaller than a vertical depth d2 of a second trench 52.

Referring to a manufacturing step of the semiconductor device 10 shown in FIG. 2C, the first TIM layer 170 is filled into the first trench 51 for being deposited on the first semiconductor package 100, and the second TIM layer 270 is filled into the second trench 52 for being deposited on the second semiconductor package 200. In the present embodiment, after deposition of the first TIM layer 170 and the second TIM layer 270, a planarization process, for example a mechanical grinding or chemical mechanical polishing (CMP) process, is further applied to remove excessive portions of the first TIM layer 170 and the second TIM layer 270. Hence, the top surface 171 of the first TIM layer 170 and the top surface 271 of the second TIM layer 270 are coplanar with the top surface 55 of the encapsulation layer 50 for further performing manufacturing processes thereon. As shown in FIG. 2C, the vertical thickness t1 of the first TIM layer 170 is thinner than the vertical thickness t2 of the second TIM layer 270.

In some embodiments, materials for forming both the first TIM layer 170 and the second TIM layer 270 may include thermal epoxy, thermal epoxy resin, thermal conductive paste, aluminum oxide, zinc oxide, boron nitride, pulverized silver, or thermal grease.

As shown in FIG. 2A, in some embodiments, the first DAF 32 and the second DAF 34 may be an epoxy resin, a phenolic resin, an acryl rubber, a cerium oxide filler, or a combination thereof, which is carried out by a laminate method. However, any suitable alternative forming materials and methods can also be applied.

Figure 3A:
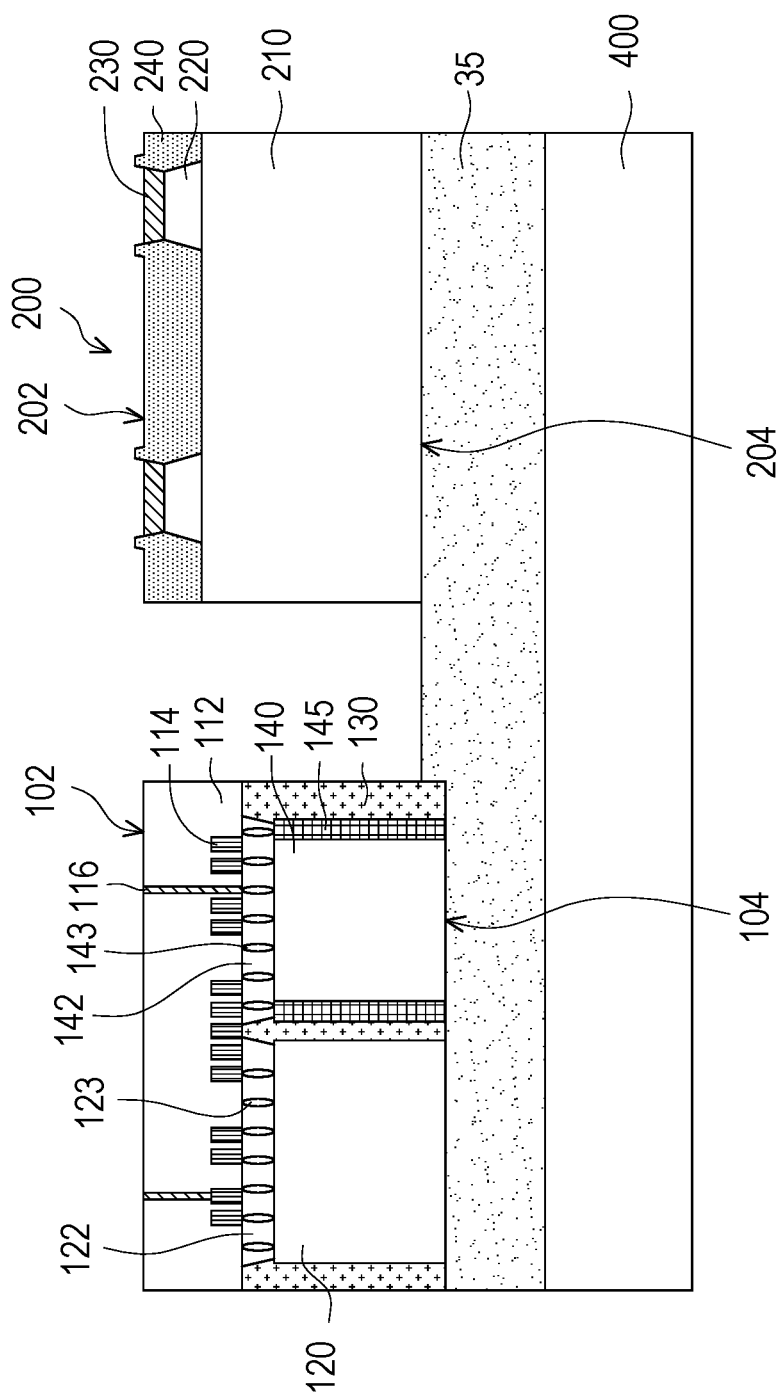
FIG. 3A to FIG. 3C illustrate cross sectional views of intermediate stages in a manufacturing of a semiconductor device according to some exemplary embodiments of the present disclosure.
Figure 3B:
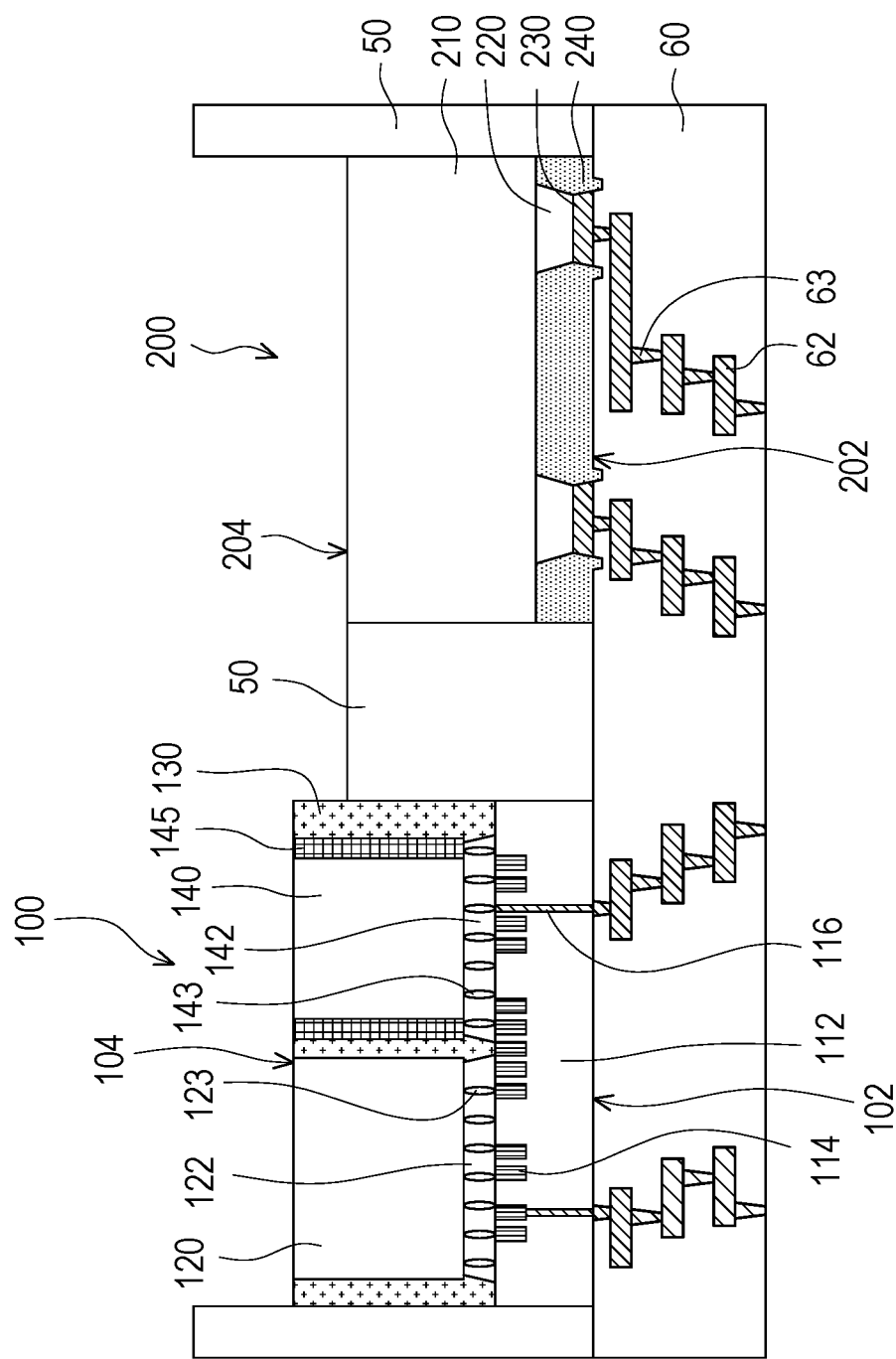
Figure 3C:
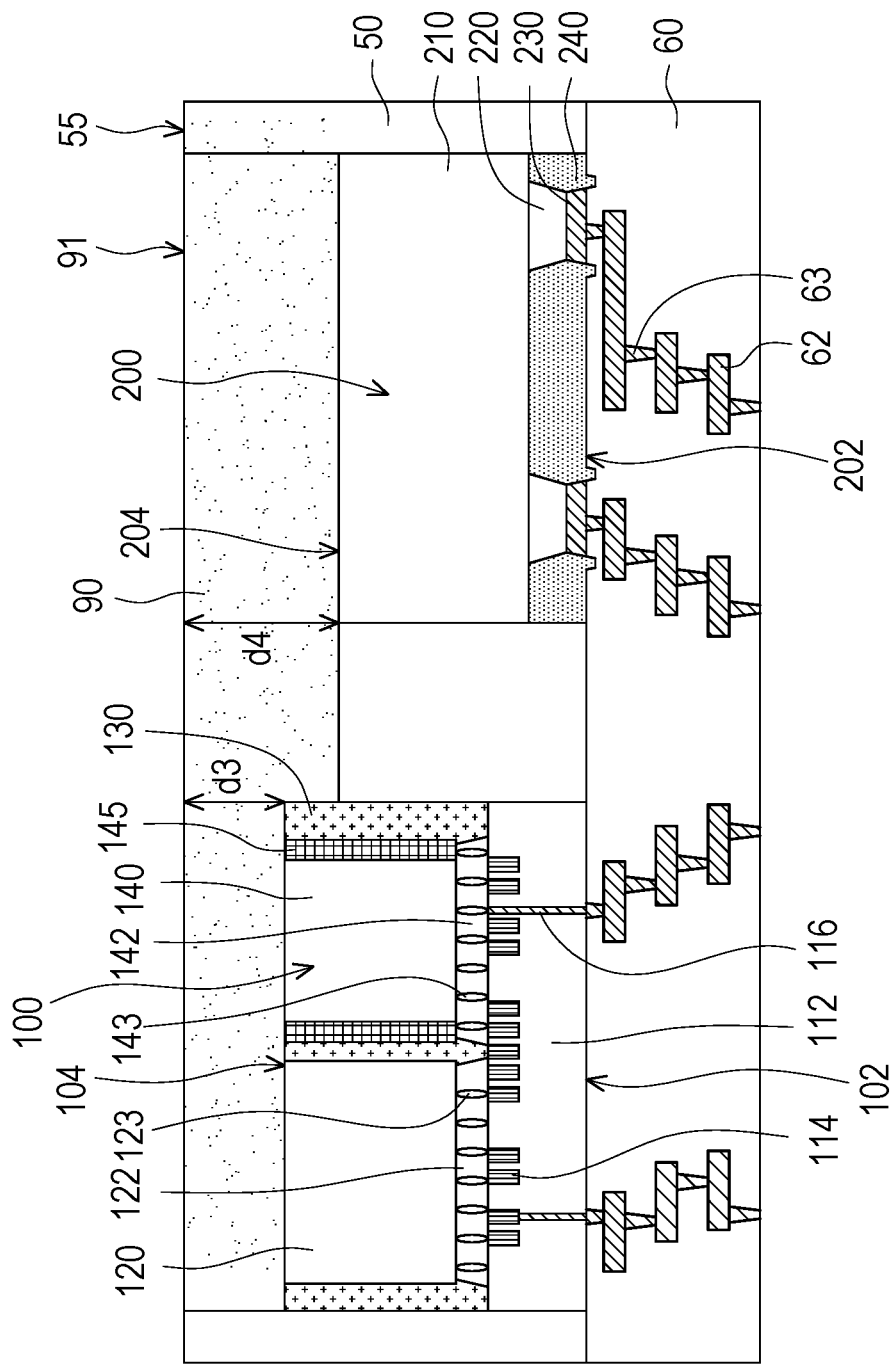

FIG. 3A to FIG. 3C illustrates cross sectional views of intermediate stages in a manufacturing of a semiconductor device 10 according to some exemplary embodiments of the present disclosure. In the present embodiments, referring to FIG. 3A, both the back surface 104 of the first semiconductor package 100 and the back surface 204 of the second semiconductor package 200 are attached on the carrier 400 through a single die attach film (DAF) 35 disposed therebetween. In the present embodiment, a vertical weight of the first semiconductor package 100 may be different from a vertical weight of the second semiconductor package 200. For example, as shown in FIG. 3A, the vertical weight of the first semiconductor package 100 may be greater than the vertical weight of the second semiconductor package 200. Due to the vertical weight difference, a die-bonding force applied from the first semiconductor package 100 by its vertical weight to the DAF 35 is greater than a die-bonding force applied from the second semiconductor package 200 by its vertical weight to the DAF 35, such that the first semiconductor package 100 is sunk into the DAF 35 deeper than the second semiconductor package 200, which may also compensate am asymmetrical vertical height difference between the first semiconductor package 100 and the second semiconductor package 200. Hence, the front surface 102 of the first semiconductor package 100 may be aligned with the front surface 202 of the second semiconductor package 200 for performing subsequent front-end manufacturing processes thereon.

In some embodiments, the DAF 35 may be an epoxy resin, a phenolic resin, an acryl rubber, a cerium oxide filler, or a combination thereof, which is carried out by a laminate method. However, any suitable alternative forming materials and methods can also be applied.

As shown in FIG. 3A and FIG. 3B, an encapsulation material is deposited on the carrier 400 to form the encapsulation layer 50, which laterally encapsulates and surrounds first semiconductor package 100 and the second semiconductor package 200. In some embodiments not illustrated, after depositing the encapsulation material, a planarization process, for example a mechanical grinding process or a chemical mechanical polishing (CMP) process, can be applied to remove an excessive portion of the encapsulating material to align a surface of the encapsulation layer 50 with the front surface 102 of the first semiconductor package 100 and the front surface 202 of the second semiconductor package 200 for performing following manufacturing steps thereon.

Referring again to FIG. 3A and FIG. 3B, in the current manufacturing step of the semiconductor device 10, the carrier 400 is flipped to attach both the front surface 102 of the first semiconductor package 100 and the front surface 202 of the second semiconductor package 200 to the first redistribution structure 60. Followingly, the carrier 400 is debonded from the first semiconductor package 100, the second semiconductor package 200, the encapsulation layer 50, and the DAF 35.

As shown in FIG. 3B, after removing the carrier 400, the DAF 35 is cleaned and removed from the first semiconductor package 100 and the second semiconductor package 200 to expose the back surfaces 104, 204 thereof and a portion of the encapsulation layer 50. In some embodiments, the DAF 35 may be water soluble and can be removed with an aqueous solution. As shown in FIG. 3B, in the present embodiment, after the first semiconductor package 100 and the second semiconductor package 200 attaching to the first encapsulation structure 60, the back surface 104 of the first semiconductor package 100 may be protruded from the back surface 204 of the second semiconductor package 200 and the portion of the encapsulation layer 50 disposed therebetween in a range substantially from 5 microns to 8 microns.

Referring to the manufacturing step of the semiconductor device 10 shown in FIG. 3C, a single TIM layer 90 is deposited on the back surface 102 of the first semiconductor package 100, the back surface 104 of the second semiconductor package 200, and a top surface of the portion of the encapsulation layer 50. In the present embodiments, after deposition of the TIM layer 90, a planarization process, for example a mechanical grinding or a CMP process, is further applied to remove excessive portions of the TIM layer 90. Hence, a top surface 91 of the TIM layer 90 is coplanar with a top surface 55 of the encapsulation layer 50 for manufacturing processes to be further performed thereon. As shown in FIG. 2C, a distance d3 from the back surface 104 of the first semiconductor package 100 to the top surface 91 of the TIM layer 90 is different from a distance d4 from the back surface 204 of the second semiconductor package 200 to the top surface 91 of the TIM layer 90, and the distance difference may be compensated by the TIM layer 90 disposed on the first semiconductor package 100 and the second semiconductor package 200.

In the present embodiment, by disposing a single TIM layer 90 on both the first semiconductor package 100 and the second semiconductor package 200, the structure formed above the first semiconductor package 100 and the second semiconductor package 200 may have equilibrium warpage and a flat surface formed on the top surface of the TIM layer 90 by controlling a coefficient of thermal expansion (CTE) thereof.

Figure 4A:
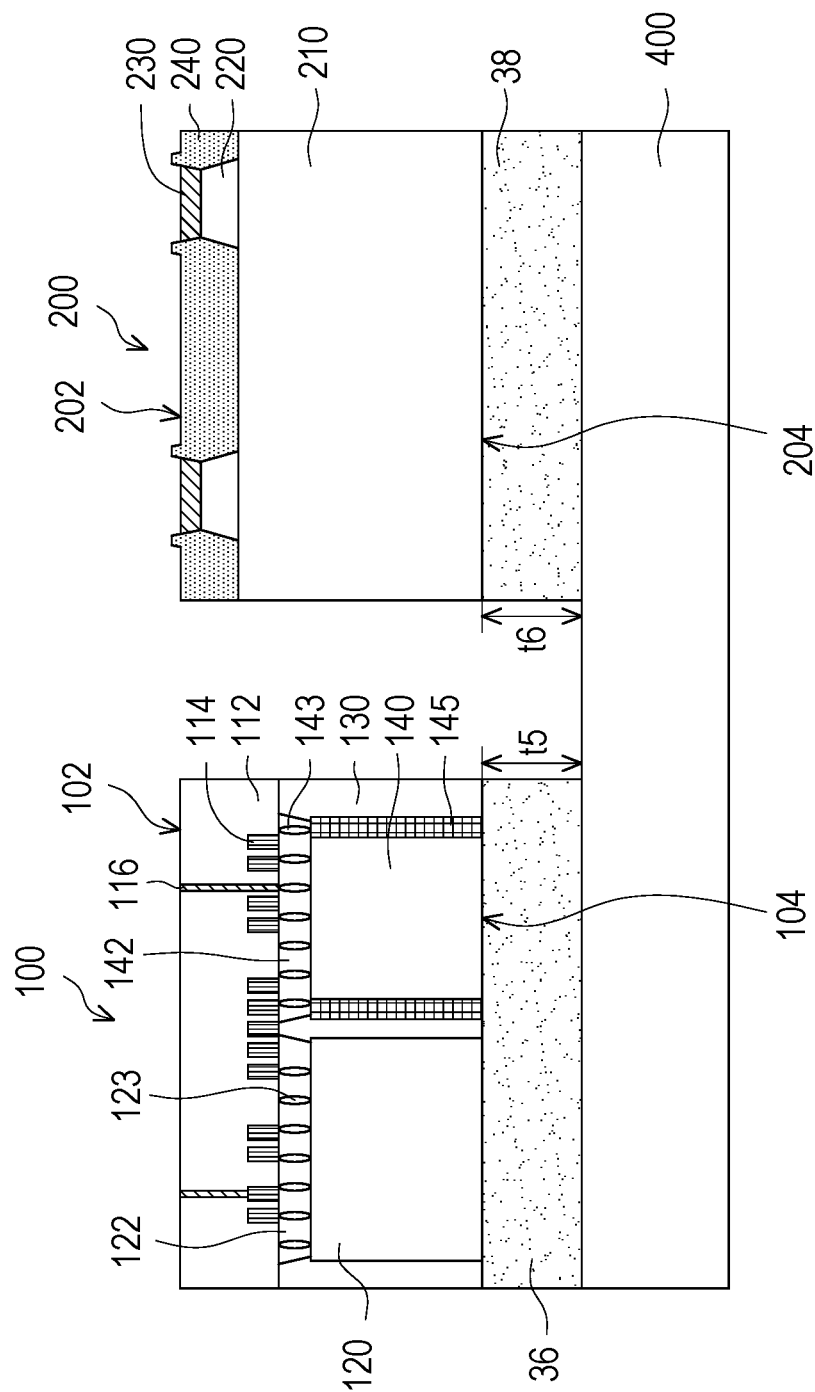
FIG. 4A to FIG. 4C illustrate cross sectional views of intermediate stages in a manufacturing of a semiconductor device according to some exemplary embodiments of the present disclosure.
Figure 4B:
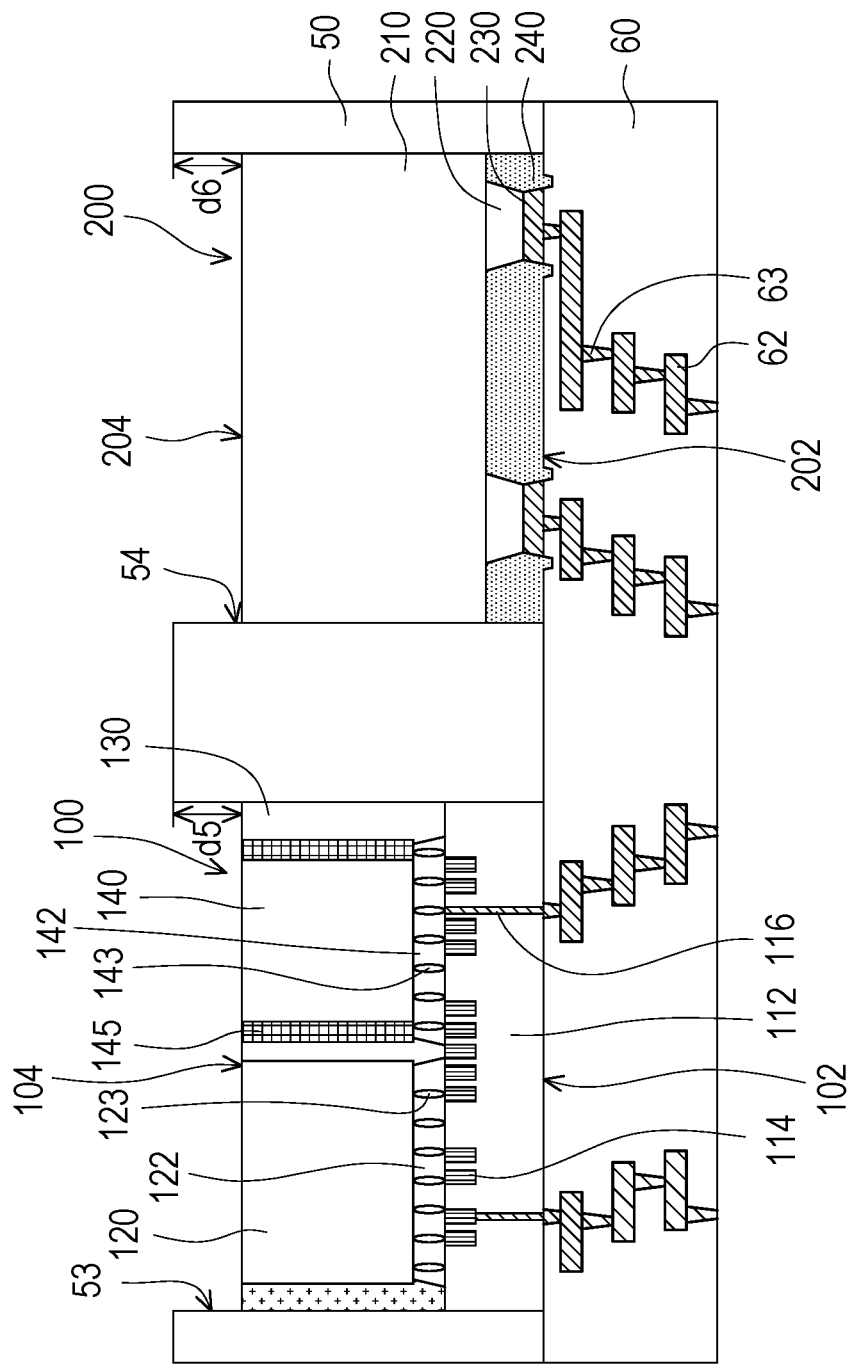
Figure 4C:
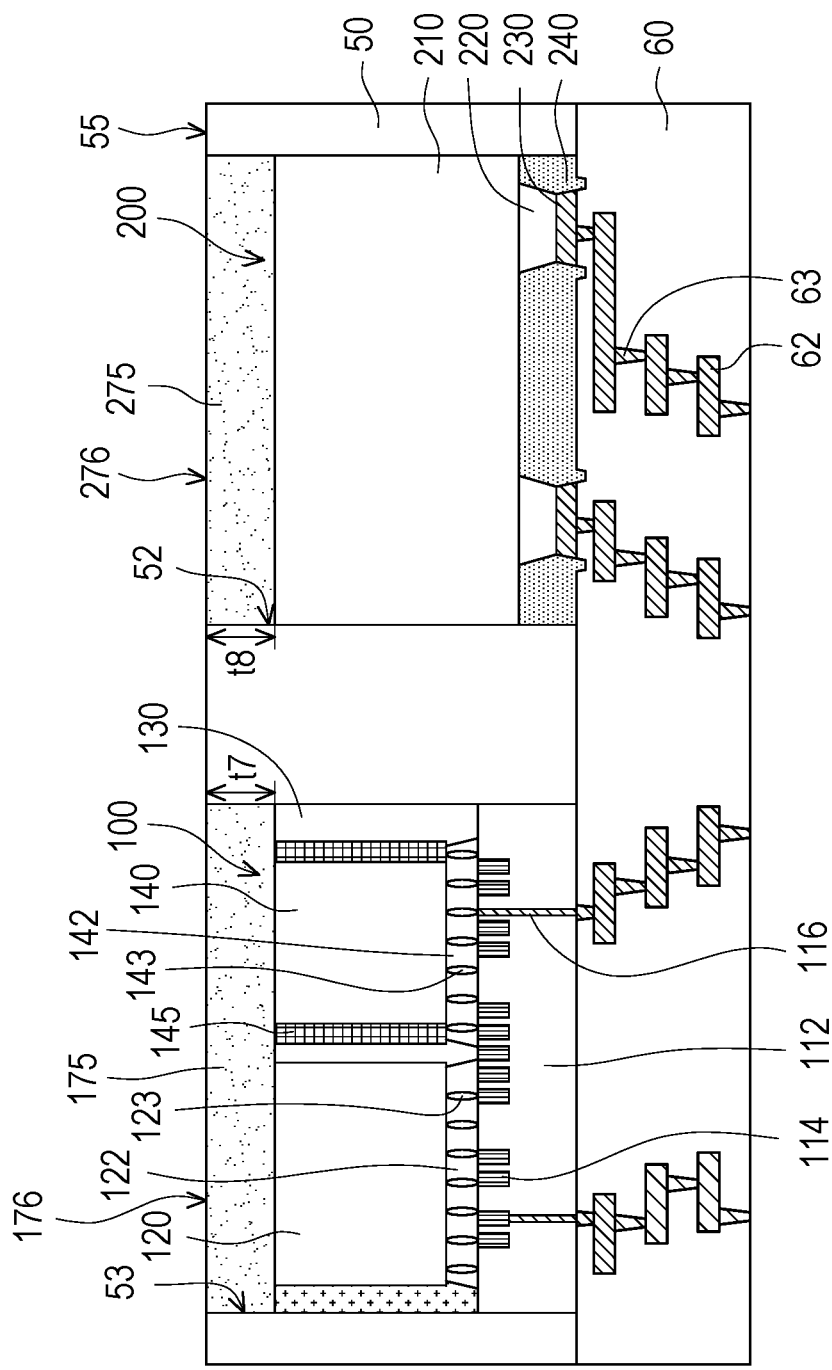

FIG. 4A to FIG. 4C illustrate cross sectional views of intermediate stages in a manufacturing of a semiconductor device 10 according to some exemplary embodiments of the present disclosure. The current embodiment of the manufacturing steps shown in FIG. 4A to FIG. 4C is different from the embodiment of the manufacturing steps shown in FIG. 2A to FIG. 2C in that, as shown in FIG. 4A, the first semiconductor package 100 is attached to the carrier 400 through a first die attach film (DAF) 36, and the second semiconductor package 200 is attached to the carrier 400 through a second DAF 38. In the present embodiment, the first DAF 36 may have a vertical thickness t5 same with a vertical thickness t6 of the second DAF 38.

In the present embodiment, the first DAF 36 and the second DAF 38 are respectively formed by difference materials, which have different weight densities. Hence, the first DAF 36 and the second DAF 38 may respectively provide different forces of vertical supports respectively to the first semiconductor package 100 and the second semiconductor package 200, which may compensate a vertical height unevenness between the first semiconductor package 100 and the second semiconductor package 200 caused by their die-bonding forces respectively with the first DAF 36 and the second DAF 38. For example, in the present embodiment, the first semiconductor package 100 and the semiconductor package 300 may have a vertical height difference, which is about 25 microns, which can be compensated by the above difference between the first DAF 36 and the second DAF 38.

In the present embodiment, the first DAF 36 and the second DAF 38 may be respectively formed of an epoxy resin, a phenolic resin, an acryl rubber, a cerium oxide filler, or a combination thereof, which is carried out by a laminate method depending on the die-bond forces of the first semiconductor package 100 and the second semiconductor package 200. However, any suitable alternative forming materials and methods can also be applied.

Referring to FIG. 4A and FIG. 4B, after the first semiconductor package 100 and the second semiconductor package 200 are attached to the carrier 400, an encapsulation material is deposited on the carrier 400 for forming the encapsulation layer 50, which laterally encapsulates and surrounds the first semiconductor package 100 and the second semiconductor package 200. In the current embodiment of the disclosure, after depositing the encapsulation material, a planarization process, for example a mechanical grinding or chemical mechanical polishing (CMP) process, can be applied to remove an excessive portion of the encapsulating material to align the surface of the encapsulation layer 50 with the front surface 102 of the first semiconductor package 100 and the front surface 202 of the second semiconductor package 200 for performing subsequent manufacturing processes thereon.

As shown in FIG. 4B, in the current step of the manufacturing process, the carrier 400 is flipped to attach both the front surface 102 of the first semiconductor package 100 and the front surface 202 of the second semiconductor package 200 to the first redistribution structure 60. Subsequently, the carrier 400 is debonded from the first semiconductor package 100 and the second semiconductor package 200 to expose the surfaces of the first DAF 36 and the second DAF 38.

As shown in FIG. 4B, after attaching the first semiconductor package 100 and the second semiconductor package 200 to the first redistribution structure 60 and debonding the carrier 400 therefrom, the first DAF 36 and the second DAF 38 are respectively cleaned and removed from the first semiconductor package 100 and the second semiconductor package 200 to respectively expose the back surfaces 104 and 204 thereof. In some embodiments, the first DAF 36 and the second DAF 38 may be water soluble and can be removed with an aqueous solution.

Referring to FIG. 4B, a first trench 53 and a second trench 54 within the encapsulation layer 50 are correspondingly formed above the first semiconductor package 100 and the second semiconductor package 200 after removing the first DAF 36 and the second DAF 38. In the present embodiment, a vertical depth d5 of a first trench 53 may be substantially same with a vertical depth d6 of a second trench 54.

As the manufacturing step shown in FIG. 4C, a first TIM layer 175 is disposed in the first trench 53 to be deposited on the first semiconductor package 100, and a second TIM layer 275 is disposed in the second trench 54 to be deposited on the second semiconductor package 200. In the present embodiments, after deposition of the first TIM layer 175 and the second TIM layer 275, a planarization process, for example a mechanical grinding process or a CMP process, is further applied to remove excessive portions of the first TIM layer 175 and the second TIM layer 275. Hence, a top surface 176 of the first TIM layer 170 and a top surface 276 of the second TIM layer 270 are coplanar with the top surface 55 of the encapsulation layer 50 for manufacturing processes being further performed thereon.

As shown in FIG. 4C, in the present embodiment, a vertical thickness t7 of the first TIM layer 175 is substantially equal to a vertical thickness t8 of the second TIM layer 275. In some embodiments, the first TIM layer 175 and the second TIM layer 275 may be respectively composed of thermal epoxy, thermal epoxy resin, thermal conductive paste, aluminum oxide, zinc oxide, boron nitride, pulverized silver, or thermal grease.

Figure 5A:
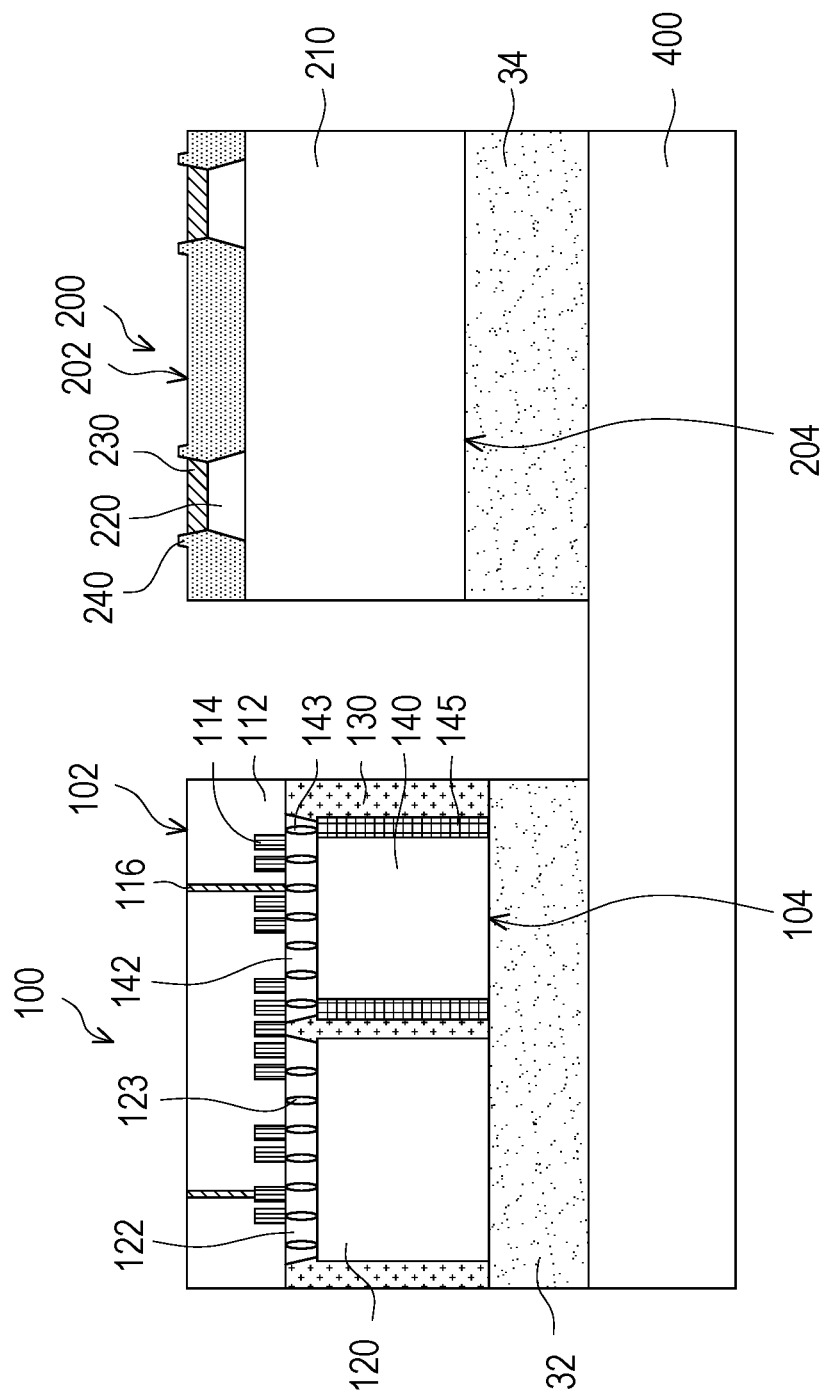
FIG. 5A to FIG. 5E illustrate cross sectional views of stages in manufacturing a semiconductor device according to some exemplary embodiments of the present disclosure.
Figure 5B:
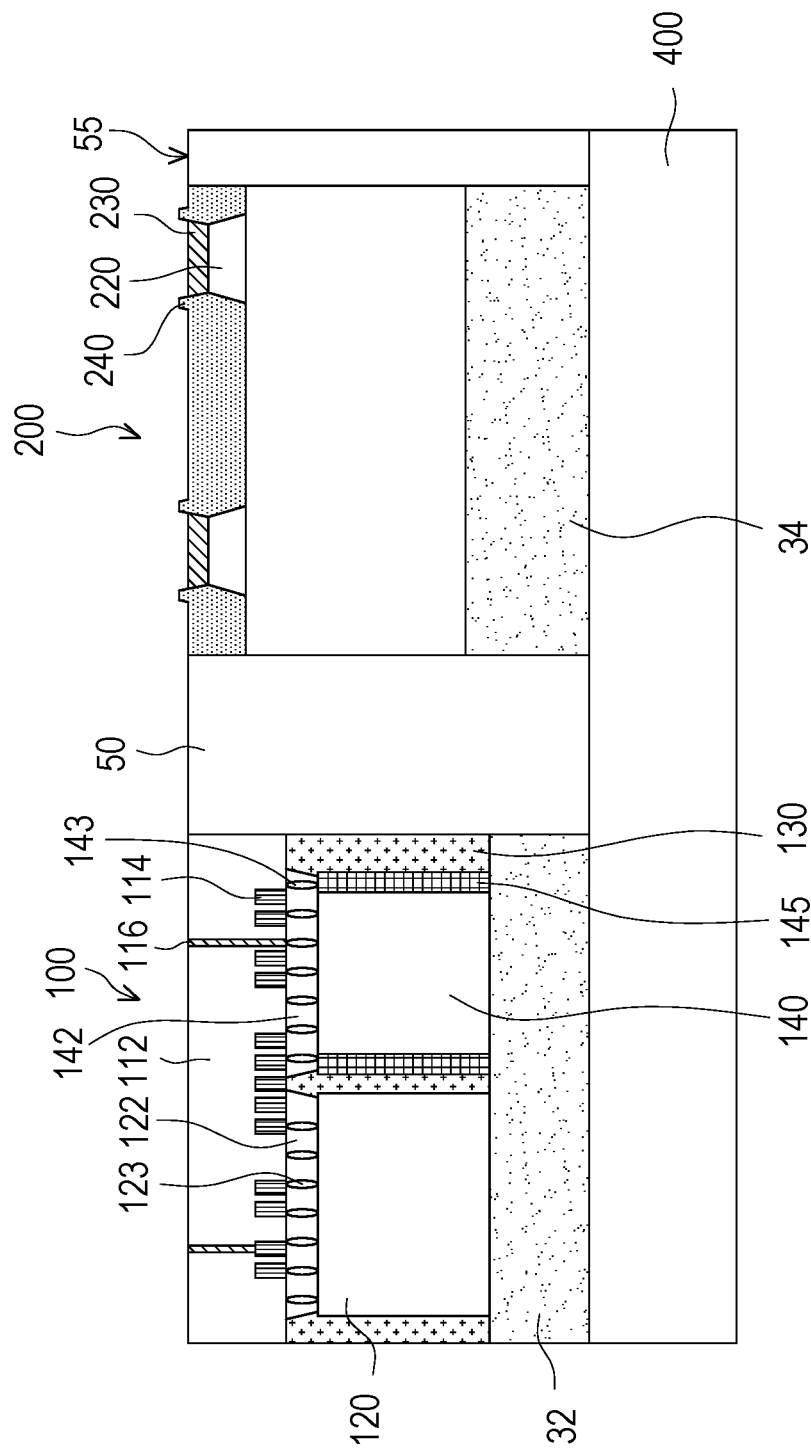
Figure 5C:
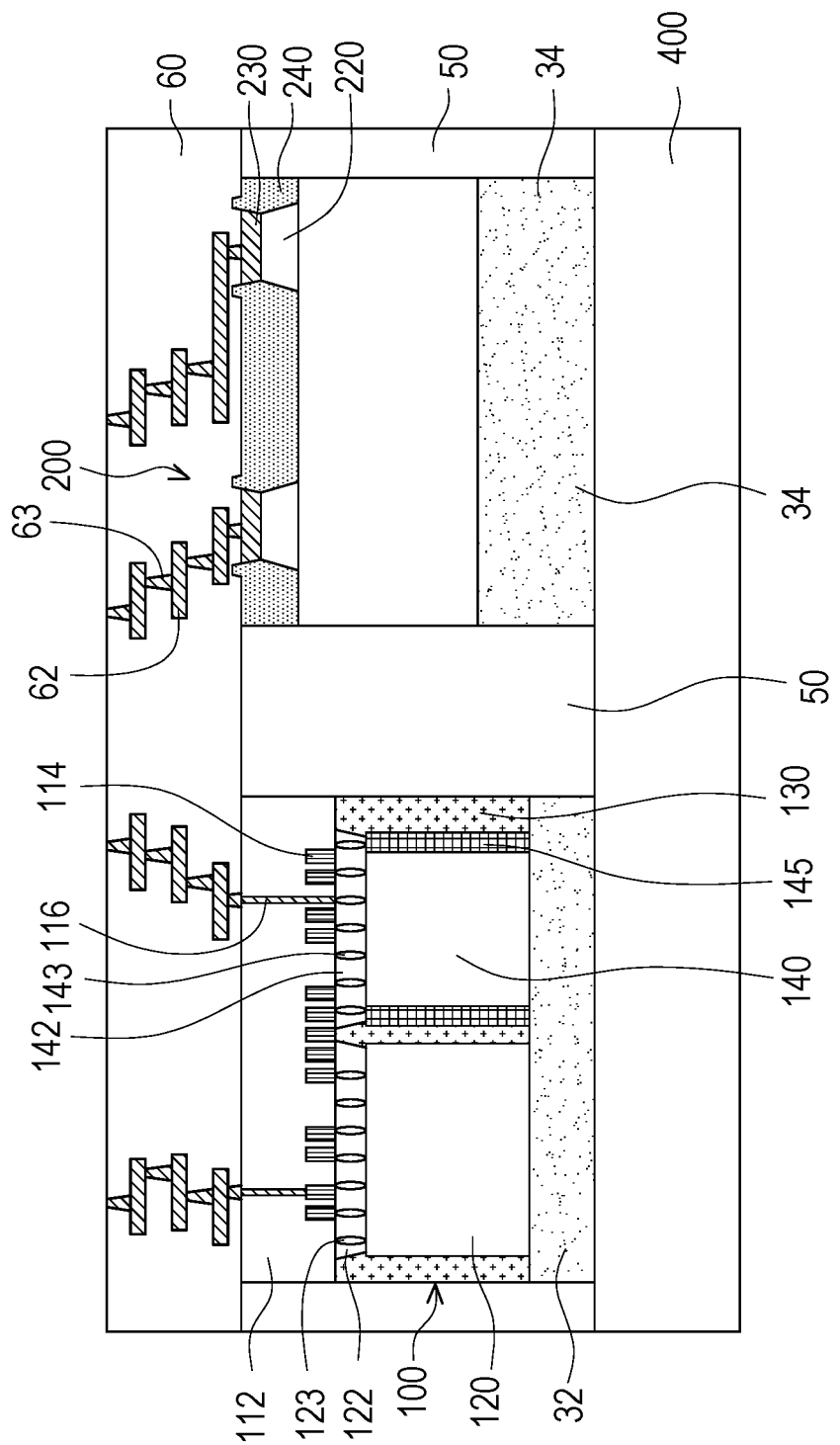

FIG. 5A to FIG. 5E illustrate cross sectional views of stages in manufacturing a semiconductor device 10 according to some exemplary embodiments of the present disclosure. In the present embodiment, the manufacturing processes shown in FIG. 5A to FIG. 5C is similar or the same with the manufacturing processes shown in FIG. 2A to FIG. 2C, and thereby the same or similar descriptions for manufacturing processes shown in FIG. 5A to FIG. 5C will not be repeated herein.

Figure 5D:
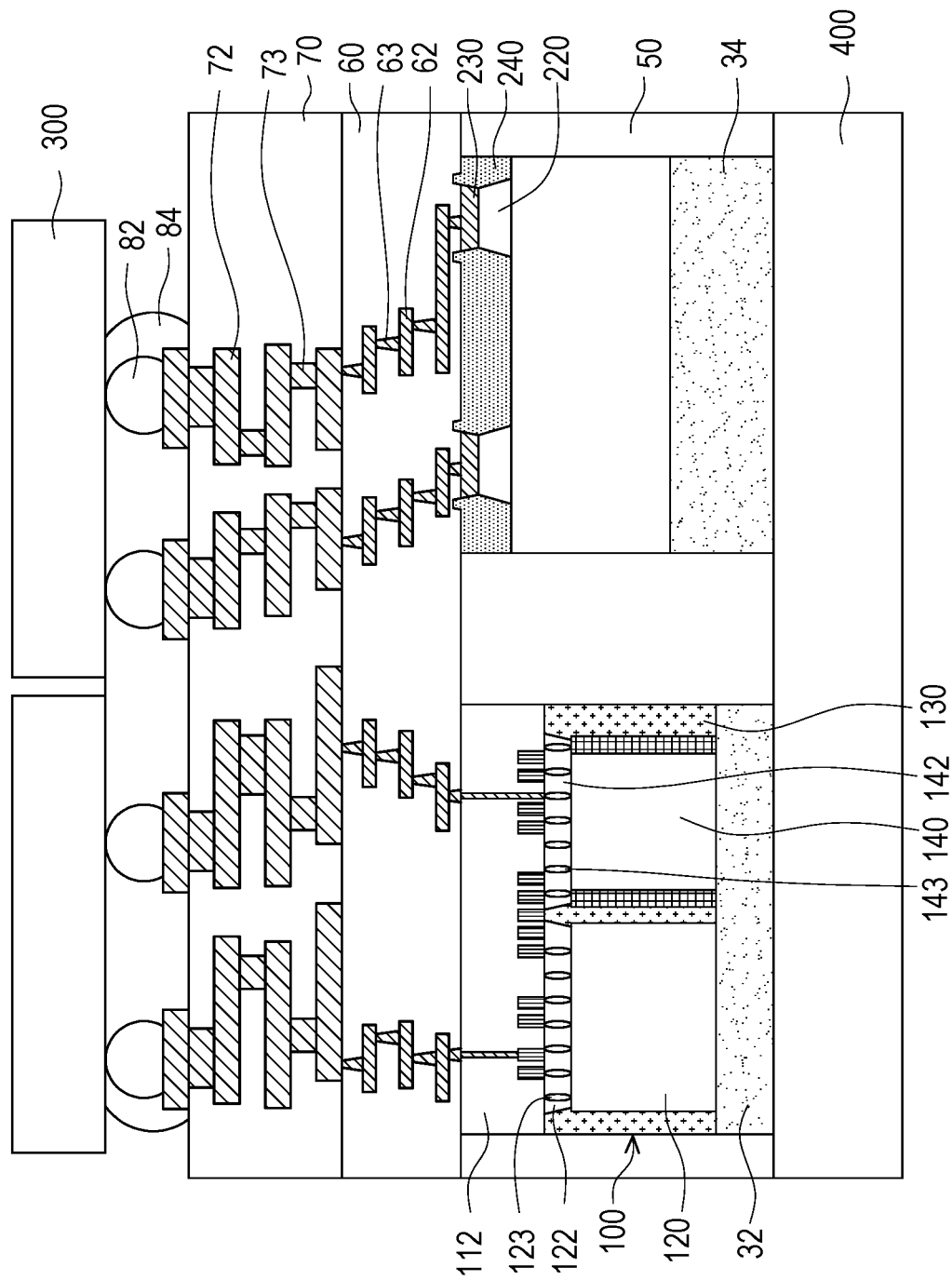

In the present embodiment, referring the manufacturing step of the semiconductor device 10 shown in FIG. 5D, after the first semiconductor package 100 and the second semiconductor package 200 being disposed on the first redistribution structure 60 and prior to the carrier 400 being debonded, the second redistribution structure 70 is further disposed on the first redistribution structure 60. The conductive pattern layers of 72 of the second redistribution structure 70 may be electrically connected the first semiconductor package 100 and the second semiconductor package 200 through the connective pattern layers 62 and the conductive vias 63 of the first redistribution structure 60 interconnected therebetween.

Referring again to FIG. 5D, the voltage regulator modules 300 are respectively disposed over the second redistribution structure 70. In some embodiments, the conductive elements 82 and the underfill 84 laterally surrounding the conductive elements 82 are formed between the voltage regulator modules 300 and the second redistribution structure 70.

Figure 5E:
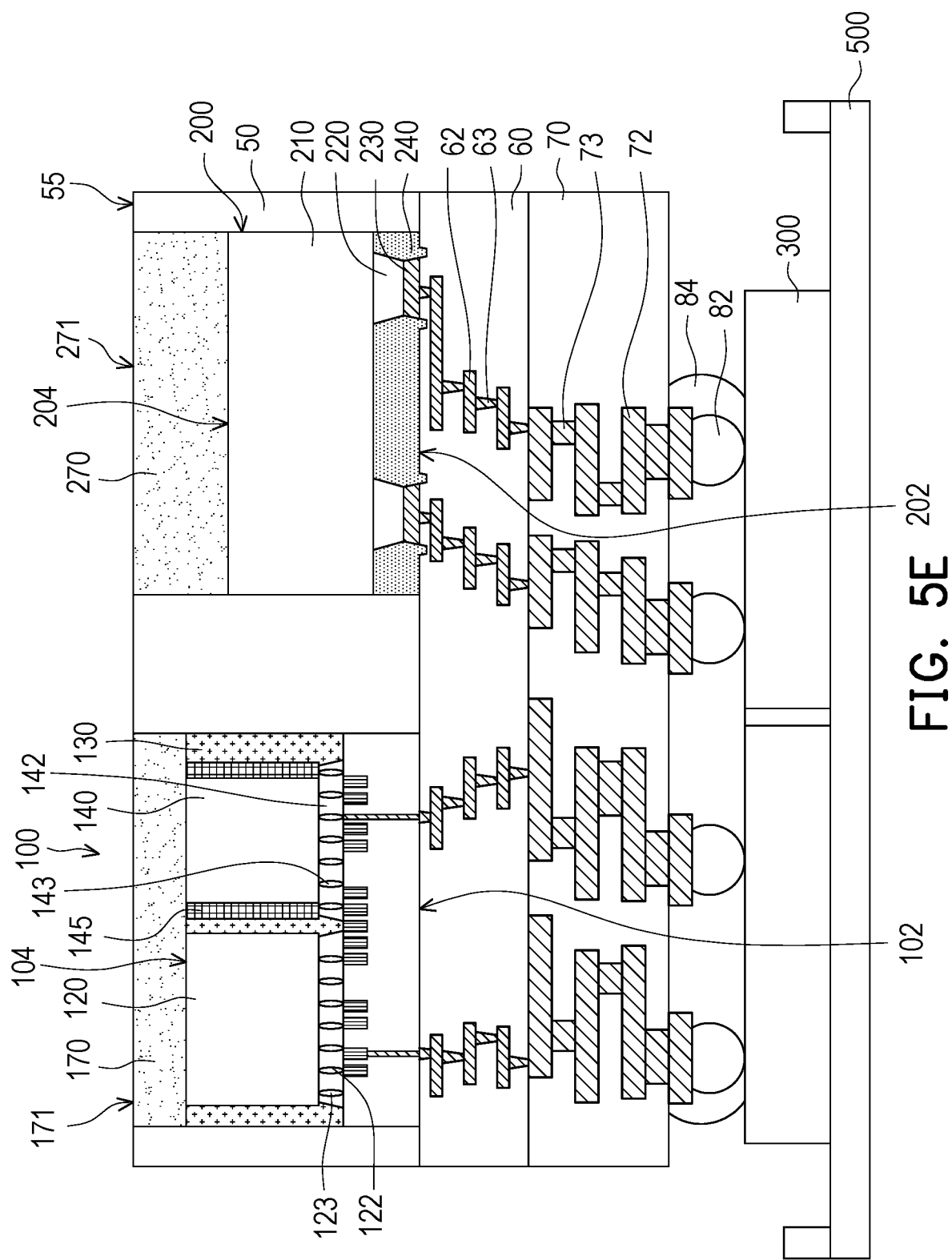

Referring to the manufacturing step of the semiconductor device 10 shown in FIG. 5D and FIG. 5E, surfaces of the voltage regulator modules 300 may be attached to a carrier tape 500. Moreover, the carrier 400 is debonded from the first DAF 32 and the second DAF 34, and the first DAF 32 and second DAF 34 are subsequently cleaned and removed to expose the back surface 104 of the first semiconductor package 100 and the back surface 204 of the second semiconductor package 200.

Referring again to FIG. 5E, the first TIM layer 170 and the second TIM layer 270 are respectively disposed on the back surface 104 of the first semiconductor package 100 and the back surface 204 of the second semiconductor package 200. A planarization process, for example a mechanical grinding process or a chemical mechanical polishing (CMP) process, may be applied to remove an excessive portion of the first TIM layer 170 and the second TIM layer 270 to align the top surface 171 of the first TIM 170 and the top surface 271 of the second TIM 270 with the top surface 55 of the encapsulation layer 50 for performing a back-end assembly process for the semiconductor device 10.

Figure 6:
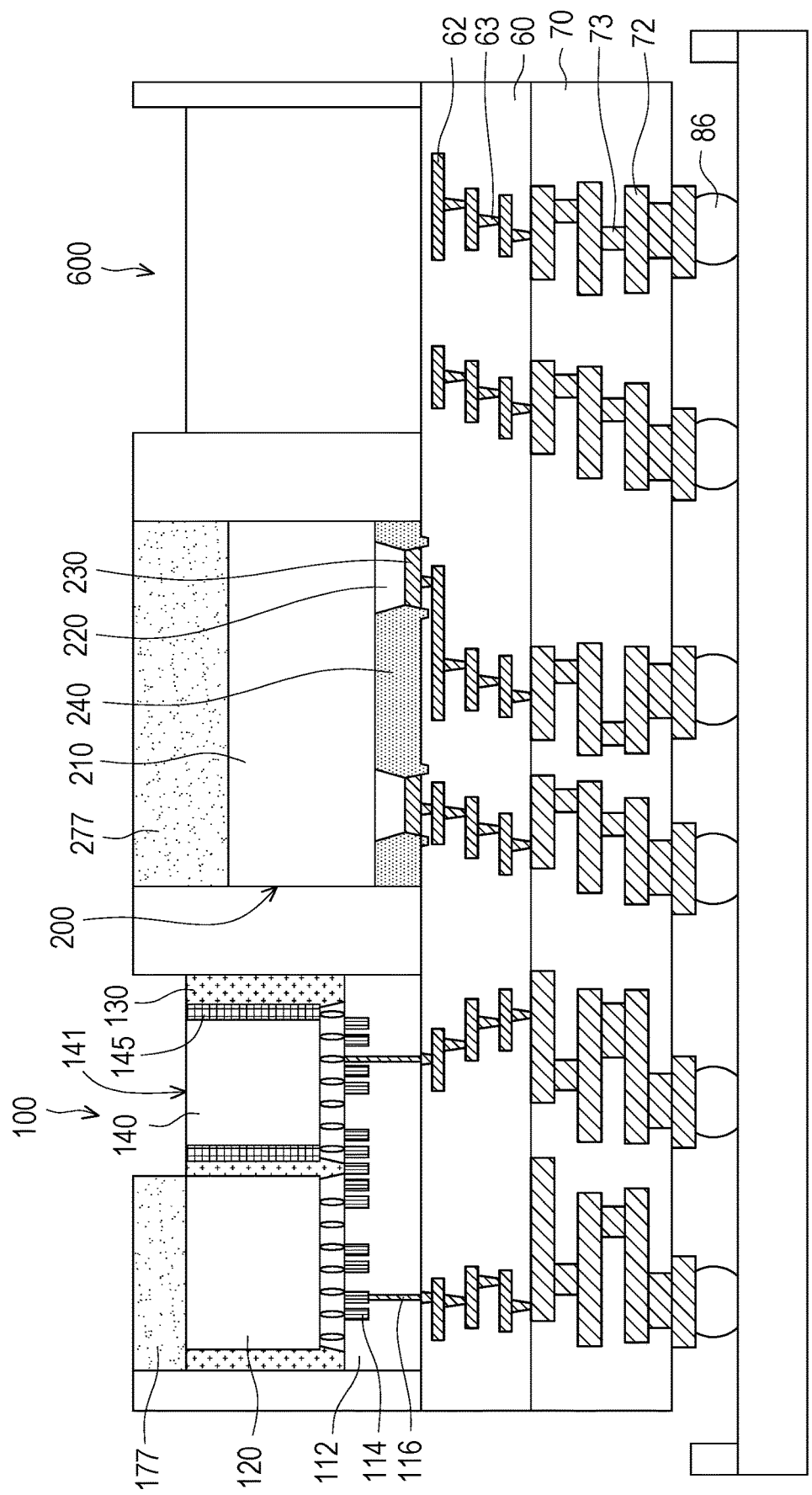
FIG. 6 illustrates a cross sectional view of a semiconductor device according to another embodiment of the present disclosure.

FIG. 6 illustrates a cross sectional view of a semiconductor device 10 according to another embodiment of the present disclosure. In the present embodiment, referring to FIG. 6, the semiconductor device 10 may further include a dummy die 600 disposed laterally aside the first semiconductor package 100 and the second semiconductor package 200. In the present embodiment, the dummy die 600 is surrounded by the encapsulation layer 50 together with the first semiconductor package 100 and the second semiconductor package 200. In some embodiments, facilitation of heat dissipation by a TIM layer may not be required by the dummy die 600, and thereby, as shown in FIG. 6, a top surface of the dummy die 600 may be directly exposed from the encapsulation layer 50 without needs of disposing the TIM layer thereon.

In the present embodiments, the memory component 140 may be an HBM component. In some embodiments, referring to FIG. 6, the memory component 140 may also not require a TIM layer to be disposed thereon for facilitating heat dissipation. Hence, in the present embodiment, a first TIM layer 177 may partially cover the first semiconductor package 100, such that the first TIM layer 177 merely disposed on the SOC circuit 120, and a top surface of the memory component 140 may be exposed from the molding compound 145, the insulating encapsulation 130, and the first TIM layer 177. Moreover, as shown in FIG. 6, a second TIM layer 277 is disposed on the second semiconductor package 200 having the SOC circuit 210 disposed therein. In the present embodiment, the deposition of the TIM layers may be applied based on the practical needs and functions of each of semiconductor packages or each semiconductor dies, and the disclosure is not limited herein.

Based on the above descriptions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor device includes a first redistribution structure, a first semiconductor package, a second semiconductor package, an encapsulation layer, a first thermal interface material (TIM) layer, and a second TIM layer. The first semiconductor package is disposed on the first redistribution structure. The second semiconductor package is disposed on the first redistribution structure and laterally disposed aside the first semiconductor package. The encapsulation layer encapsulates and surrounds the first semiconductor package and the second semiconductor package. The first semiconductor package and the second semiconductor package are respectively exposed from the encapsulation layer. The first TIM layer is disposed on a back surface of the first semiconductor package. The second TIM layer is disposed on a back surface of the second semiconductor package. A top surface of the first TIM layer and a top surface of the second TIM layer are coplanar with a top surface of the encapsulation layer. A vertical thickness of the first TIM layer is different from a vertical thickness of the second TIM layer.

In accordance with some embodiments of the disclosure, a manufacturing method of a semiconductor device includes the following steps. A first semiconductor package is disposed to a carrier through a first die attach film (DAF) disposed therebetween. A second semiconductor package is disposed to the carrier through a second DAF therebetween. The first DAF is different from the second DAF for aligning a front surface of the first semiconductor package with a front surface of the second semiconductor package. The first semiconductor package and the second semiconductor package are encapsulated with an encapsulation material. The encapsulation material is laterally disposed aside and surrounding the first semiconductor package and the second semiconductor package. The carrier is flipped to attach the front surface of the first semiconductor package and the front surface of the second semiconductor package to a first redistribution structure. The carrier, the first DAF, and the second DAF are removed from the first semiconductor package and the second semiconductor package to expose a back surface of the first semiconductor package and a back surface of the second semiconductor package from the encapsulation material. A first thermal interface material (TIM) layer and a second TIM layer are respectively disposed on the back surface of the first semiconductor package and the back surface of the second semiconductor package. A top surface of the first TIM layer and a top surface of the second TIM layer are coplanar with a top surface of the encapsulation material. A thickness of a first layer TIM is different from a thickness of a second TIM layer.

In accordance with some embodiments of the disclosure, a manufacturing method of a semiconductor device includes the following steps. A first semiconductor package and a second semiconductor package are disposed on a carrier through a die attach film. The first semiconductor package and the second semiconductor package are encapsulated with an encapsulation material. The encapsulation material is laterally disposed aside and surrounding the first semiconductor package and the second semiconductor package. The carrier is flipped to attach the front surface of the first semiconductor package and the front surface of the second semiconductor package to a first redistribution structure. The carrier and the die attach film are removed from the first semiconductor package and the second semiconductor package to expose a back surface of the first semiconductor package and a back surface of the second semiconductor package. A thermal interface material (TIM) layer is deposited on the back surface of the first semiconductor package and the back surface of the second semiconductor package. A top surface of the TIM layer is coplanar with a top surface of the encapsulation material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first redistribution structure;
   a first semiconductor package, disposed on the first redistribution structure;
   a second semiconductor package, disposed on the first redistribution structure and laterally disposed aside the first semiconductor package;
   an encapsulation layer, encapsulating and surrounding the first semiconductor package and the second semiconductor package, wherein the first semiconductor package and the second semiconductor package are respectively exposed from the encapsulation layer;
   a first thermal interface material (TIM) layer, disposed on a back surface of the first semiconductor package;
   a second TIM layer, disposed on a back surface of the second semiconductor package, wherein a top surface of the first TIM layer and a top surface of the second TIM layer are coplanar with a top surface of the encapsulation layer,
   wherein a vertical thickness of the first TIM layer is different from a vertical thickness of the second TIM layer;
   a second redistribution structure disposed on the first redistribution structure; and
   a plurality of voltage regulator modules disposed above the second redistribution structure, wherein a plurality of conductive elements and an underfill surrounding the plurality of conductive elements are disposed between the plurality of voltage regulator modules and the second redistribution structure.

2. The semiconductor device of claim 1, wherein the first semiconductor package comprises a system on chip (SOC) circuit and a memory component laterally disposed aside with each other, wherein the SOC circuit and the memory component are together encapsulated and surrounded by an insulating encapsulation.

3. The semiconductor device of claim 2, wherein the memory component is laterally surrounded by a molding compound, and a top surface of the memory component is exposed from the molding compound, the insulating encapsulation, and the first TIM layer.

4. The semiconductor device of claim 1, wherein a vertical height of the first semiconductor package is different a vertical height of the second semiconductor package.

5. The semiconductor device of claim 4, wherein a difference between the vertical height of the first semiconductor package and the vertical height of the second semiconductor package is in a range from 5 microns to 8 microns.

6. The semiconductor device of claim 1, further comprising a dummy die disposed laterally aside the first semiconductor package and the second semiconductor package, wherein the dummy die is surrounded by the encapsulation layer, and a top surface of the dummy die is exposed therefrom.

7. The semiconductor device of claim 2, wherein the memory component comprises a high bandwidth memory (HBM) component.

8. The semiconductor device of claim 6, wherein a vertical height of the top surface of the dummy die is lower than a vertical height of the top surface of the first TIM layer and the top surface of the second TIM layer.

9. A semiconductor device, comprising:
a first redistribution structure;
a first semiconductor package, disposed on the first redistribution structure;
a second semiconductor package, disposed on the first redistribution structure and laterally disposed aside the first semiconductor package;
an encapsulation layer, encapsulating and surrounding the first semiconductor package and the second semiconductor package, wherein the first semiconductor package and the second semiconductor package are respectively exposed from the encapsulation layer;
a first thermal interface material (TIM) layer, disposed on a back surface of the first semiconductor package; and
a second TIM layer, disposed on a back surface of the second semiconductor package, wherein a top surface of the first TIM layer and a top surface of the second TIM layer are coplanar with a top surface of the encapsulation layer,
wherein a vertical thickness of the first TIM layer is different from a vertical thickness of the second TIM layer,
wherein the first semiconductor package comprises a system on chip (SOC) circuit and a memory component laterally disposed aside with each other, wherein the SOC circuit and the memory component are together encapsulated and surrounded by an insulating encapsulation,
wherein the memory component is laterally surrounded by a molding compound, and a top surface of the memory component is exposed from the molding compound, the insulating encapsulation, and the first TIM layer.

10. The semiconductor device of claim 9, wherein a vertical height of the first semiconductor package is different a vertical height of the second semiconductor package.

11. The semiconductor device of claim 10, wherein a difference between the vertical height of the first semiconductor package and the vertical height of the second semiconductor package is in a range from 5 microns to 8 microns.

12. The semiconductor device of claim 1, further comprising a dummy die disposed laterally aside the first semiconductor package and the second semiconductor package, wherein the dummy die is surrounded by the encapsulation layer, and a top surface of the dummy die is exposed therefrom.

13. The semiconductor device of claim 12, wherein a vertical height of the top surface of the dummy die is lower than a vertical height of the top surface of the first TIM layer and the top surface of the second TIM layer.

14. The semiconductor device of claim 9, wherein the memory component comprises a high bandwidth memory (HBM) component.

15. A semiconductor device, comprising:
a first redistribution structure;
a first semiconductor package, disposed on the first redistribution structure;
a second semiconductor package, disposed on the first redistribution structure and laterally disposed aside the first semiconductor package;
an encapsulation layer, encapsulating and surrounding the first semiconductor package and the second semiconductor package, wherein the first semiconductor package and the second semiconductor package are respectively exposed from the encapsulation layer;
a first thermal interface material (TIM) layer, disposed on a back surface of the first semiconductor package;
a second TIM layer, disposed on a back surface of the second semiconductor package, wherein a top surface of the first TIM layer and a top surface of the second TIM layer are coplanar with a top surface of the encapsulation layer,
wherein a vertical thickness of the first TIM layer is different from a vertical thickness of the second TIM layer; and
a dummy die disposed laterally aside the first semiconductor package and the second semiconductor package, wherein the dummy die is surrounded by the encapsulation layer, and a top surface of the dummy die is exposed therefrom.

16. The semiconductor device of claim 15, wherein a vertical height of the first semiconductor package is different a vertical height of the second semiconductor package.

17. The semiconductor device of claim 16, wherein a difference between the vertical height of the first semiconductor package and the vertical height of the second semiconductor package is in a range from 5 microns to 8 microns.

18. The semiconductor device of claim 15, wherein a vertical height of the top surface of the dummy die is lower than a vertical height of the top surface of the first TIM layer and the top surface of the second TIM layer.

19. The semiconductor device of claim 15, wherein a portion of the back surface of the first semiconductor package is exposed from the first TIM layer.

20. The semiconductor device of claim 19, wherein a distance from the top surface of the encapsulation layer to the portion of the back surface of the first semiconductor substrate is different from a distance from the top surface of the encapsulation layer to the top surface of the dummy die.

* * * * *